US008927354B2

(12) United States Patent  
Chou et al.

(10) Patent No.: US 8,927,354 B2  
(45) Date of Patent: Jan. 6, 2015

(54) ANTIMONIDE-BASED COMPOUND SEMICONDUCTOR WITH TITANIUM TUNGSTEN STACK

(71) Applicants: Northrop Grumman Systems Corporation, Falls Church, VA (US); The United States of America As Represented by the Secretary of The Navy, Arlington, VA (US)

(72) Inventors: Yeong-Chang Chou, Irvine, CA (US); Jay Crawford, Long Beach, CA (US); Jane Lee, Torrance, CA (US); Jeffrey Ming-Jer Yang, Cerritos, CA (US); John Bradley Boos, Springfield, VA (US); Nicolas Alexandrou Papanicolaou, Potomac, MD (US)

(73) Assignees: Northrop Grumman Systems Corporation, Falls Church, VA (US); The United States of America As Represented by the Secretary of The Navy, Washington, DC (US)

( * ) Notice: Subject to any disclaimer, the term of this patent is extended or adjusted under 35 U.S.C. 154(b) by 0 days.

(21) Appl. No.: 13/793,251

(22) Filed: Mar. 11, 2013

(65) Prior Publication Data

US 2013/0210219 A1 Aug. 15, 2013

Related U.S. Application Data

(62) Division of application No. 11/788,145, filed on Apr. 18, 2007, now Pat. No. 8,421,121.

(51) Int. Cl.  
*H01L 21/338* (2006.01)  
*H01L 29/778* (2006.01)  
*H01L 29/66* (2006.01)

(52) U.S. Cl.  
CPC ...... *H01L 29/66431* (2013.01); *H01L 29/7783* (2013.01)  
USPC ..... 438/167; 438/172; 257/751; 257/E29.246

(58) Field of Classification Search  
CPC .............. H01L 29/66431; H01L 29/7783; H01L 29/66; H01L 29/66462; H01L 29/778; H01L 29/7786  
USPC ......... 438/167, 172, 648, 656, 652, 653, 643, 438/683, 686; 257/751, 183, E29.246, 257/E21.403, E21.407  
See application file for complete search history.

(56) References Cited

U.S. PATENT DOCUMENTS

| 4,782,380 | A | * | 11/1988 | Shankar et al. | 257/751 |
| 5,015,603 | A | * | 5/1991 | Boos et al. | 438/605 |
| 5,693,560 | A | * | 12/1997 | Hattori et al. | 257/473 |
| 6,448,648 | B1 | * | 9/2002 | Boos | 257/751 |
| 6,586,319 | B1 | * | 7/2003 | Hirano | 438/574 |
| 2003/0173584 | A1 | * | 9/2003 | Nikaido | 257/194 |
| 2006/0157735 | A1 | * | 7/2006 | Kanamura et al. | 257/194 |
| 2008/0023726 | A1 | * | 1/2008 | Adesida et al. | 257/194 |

* cited by examiner

*Primary Examiner* — Cuong Q Nguyen  
*Assistant Examiner* — Yosef Gebreyesus  
(74) *Attorney, Agent, or Firm* — Carmen Patti Law Group, LLC

(57) ABSTRACT

An apparatus in one example comprises an antimonide-based compound semiconductor (ABCS) stack, an upper barrier layer formed on the ABCS stack, and a gate stack formed on the upper barrier layer. The upper barrier layer comprises indium, aluminum, and arsenic. The gate stack comprises a base layer of titanium and tungsten formed on the upper barrier layer.

20 Claims, 5 Drawing Sheets

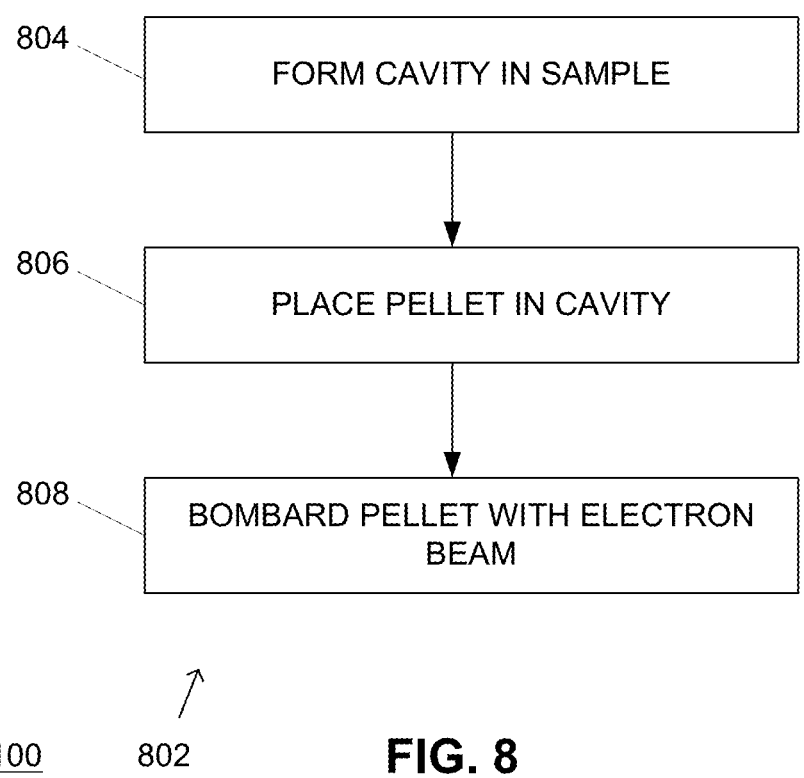

ANTIMONIDE-BASED COMPOUND SEMICONDUCTOR WITH TITANIUM TUNGSTEN STACK

STATEMENT OF GOVERNMENT RIGHTS

The Government of the United States of America has rights in this invention pursuant to Contract No. FA8750-06-C-0051 awarded by the Air Force Research Laboratory.

TECHNICAL FIELD

The invention relates generally to semiconductors and more particularly to antimonide based semiconductors.

BACKGROUND

For high electron mobility transistors (HEMT) with an epitaxial profile that has a thin barrier layer, such as antimonide-based compound semiconductors (ABCS), selection of a gate structure has been a challenge. To enhance adhesion, titanium is desirable because it reacts readily with the semiconductor. However, since the barrier layer is thin, the reaction between the titanium and the semiconductor often results in gate sinking and a non-functional transistor. This problem is accelerated by high processing temperatures for creation of the HEMT. For example, temperature cycles during the creation of the HEMT create stress at a metal-semiconductor interface, which causes a degradation of the transistor characteristics.

SUMMARY

The invention in one implementation encompasses an apparatus. The apparatus comprises an antimonide-based compound semiconductor (ABCS) stack, an upper barrier layer formed on the ABCS stack, and a gate stack formed on the upper barrier layer. The upper barrier layer comprises indium, aluminum, and arsenic. The gate stack comprises a base layer of titanium and tungsten formed on the upper barrier layer.

Another implementation of the invention encompasses a high electron mobility transistor (HEMT). The HEMT comprises an antimonide-based compound semiconductor (ABCS) stack, an upper barrier layer formed on the ABCS stack, and a gate stack formed on the upper barrier layer. The gate stack comprises a base layer formed on the upper barrier layer, a gate barrier layer formed on the base layer, and a contact layer formed on the gate barrier layer. The base layer provides a thermally stable contact with the upper barrier layer. The gate barrier layer prevents the contact layer from diffusing into the ABCS stack.

A further implementation of the invention encompasses a method. An upper barrier layer of indium, aluminum, and arsenic is formed on an antimonide-based compound semiconductor (ABCS) stack. A base layer of titanium and tungsten is formed on the upper barrier layer to prevent diffusion of a contact layer into the ABCS stack. The contact layer is formed on the base layer with layers of titanium, platinum, and gold.

DESCRIPTION OF THE DRAWINGS

Features of example implementations of the invention will become apparent from the description, the claims, and the accompanying drawings in which:

FIG. 8 is a representation of one implementation of a method for forming a base layer of the apparatus of FIG. 1.

DETAILED DESCRIPTION

Figure 1:
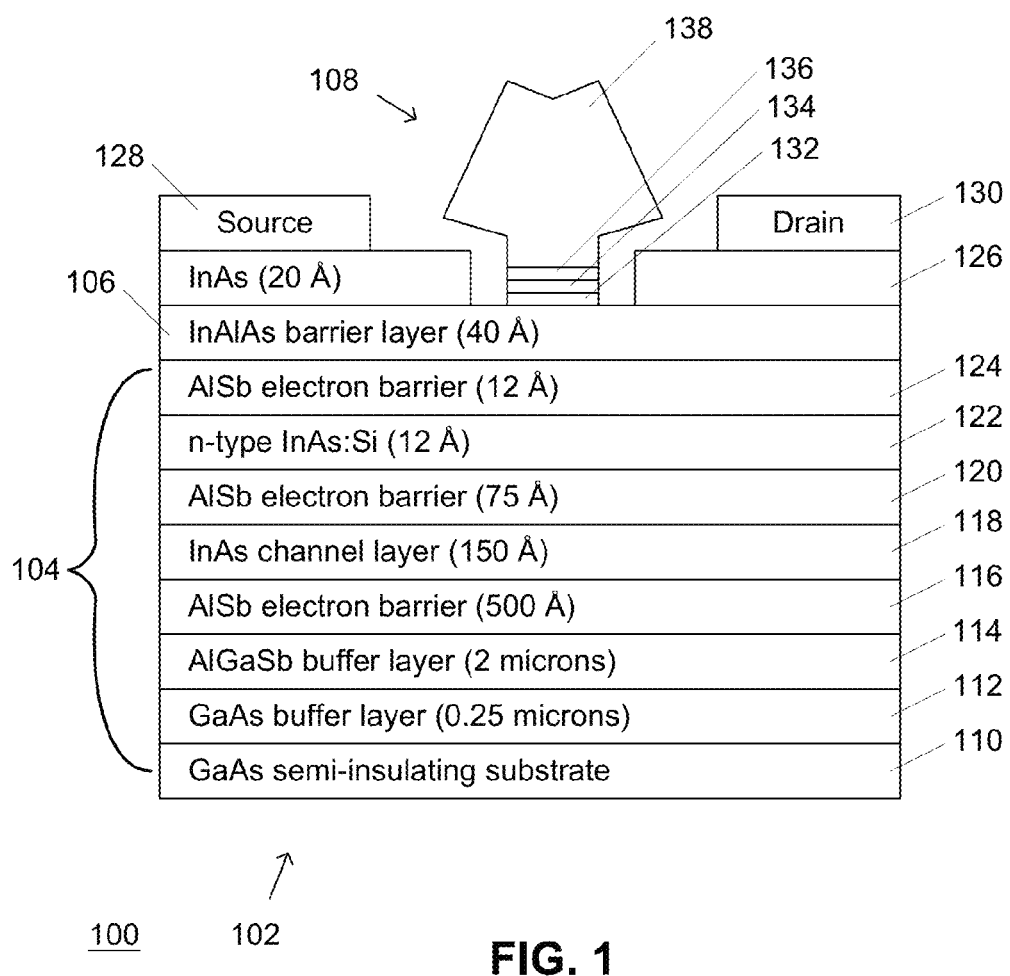
FIG. 1 is a representation of one implementation of an apparatus that comprises a profile of a semiconductor structure.

Turning to FIG. 1, an apparatus 100 in one embodiment comprises a semiconductor structure 102. The semiconductor structure 102 comprises an antimonide-based compound semiconductor (ABCS) stack 104, an upper barrier layer 106, and a gate stack 108. The semiconductor structure 102 in one example forms a transistor, for example, a high electron mobility transistor (HEMT). The ABCS stack 104, the upper barrier layer 106, and the gate stack 108 in one example provide a HEMT with an improvement in performance, uniformity, reliability, and manufacturing yields and that operates with low DC power. Tests performed on a HEMT formed in accordance with the semiconductor structure 102 showed a peak transconductance greater than 1400 ms/mm, a gate leakage current less than 1 mA/mm, and a pinch-off current of 5 mA/mm.

The ABCS stack 104 in one example comprises a stacked arrangement of layers with at least one antimonide-based layer. In the embodiment of FIG. 1, the ABCS stack 104 comprises a semi-insulating substrate 110, a first buffer layer 112, a second buffer layer 114, a first electron barrier 116, a channel layer 118, a second electron barrier 120, an n-type layer 122, and a third electron barrier 124.

Referring to the embodiment of FIG. 1, the semi-insulating substrate 110 comprises gallium arsenide. The first buffer layer 112 comprises a layer of gallium arsenide of approximately 0.25 microns. The second buffer layer 114 comprises a layer of aluminum, gallium, and antimony which is relatively thicker than the first buffer layer 112, at approximately 2 microns. In one example, the second buffer layer 114 comprises a layer of $Al_{0.7}Ga_{0.3}Sb$. In another example, the second buffer layer 114 comprises a lower layer of aluminum antimonide of approximately 1.7 microns and an upper layer of aluminum gallium antimonide of approximately 0.3 microns. The first electron barrier 116, second electron barrier 120, and third electron barrier 124 comprise layers of aluminum antimonide with thicknesses of approximately 500 angstroms, 75 angstroms, and 12 angstroms, respectively. The channel layer 118 comprises a layer of indium arsenide of approximately 150 angstroms. The n-type layer 122 comprises a layer of indium arsenide with silicon of approximately 12 angstroms. Alternative materials and thicknesses may be used within the ABCS stack 104, as will be appreciated by those skilled in the art.

The upper barrier layer 106, in the embodiment of FIG. 1, comprises a layer of indium aluminum arsenide of approximately 40 angstroms. The upper barrier layer 106 serves as a hole barrier layer. A contact cap 126 is formed on the upper barrier layer 106. The contact cap 126 in this embodiment comprises a layer of indium arsenide of 20 angstroms. A source contact 128 and a drain contact 130 may be formed on the contact cap 126, as will be appreciated by those skilled in the art.

The gate stack 108 in one example is formed with an electron beam evaporation process. The gate stack 108 comprises a base layer 132, a lower gate barrier layer 134, an upper gate barrier layer 136, and a contact layer 138. The base layer 132 comprises a layer of titanium and tungsten of approximately 20-50 angstroms. The titanium and tungsten of the base layer 132 allows for good adhesion of the gate stack 108 to the upper barrier layer 106 while providing thermal stability, without the gate sinking as with a pure titanium solution. The contact layer 138 comprises a layer of gold. A gate barrier layer is formed between the base layer 132 and the contact layer 138. The gate barrier layer comprises a lower gate barrier layer 134 of titanium and an upper gate barrier layer 136 of platinum. The titanium of the lower gate barrier layer 134 prevents the platinum and gold from diffusing into the ABCS stack 104. The platinum of the upper gate barrier layer 136 further prevents the gold from diffusing into the ABCS stack 104, as will be appreciated by those skilled in the art. The lower gate barrier layer 134 in one example is approximately between 300-400 angstroms. The upper gate barrier layer 136 in one example is approximately between 300-500 angstroms. The contact layer 138 in one example is approximately between 4500-6500 angstroms.

Figure 2:
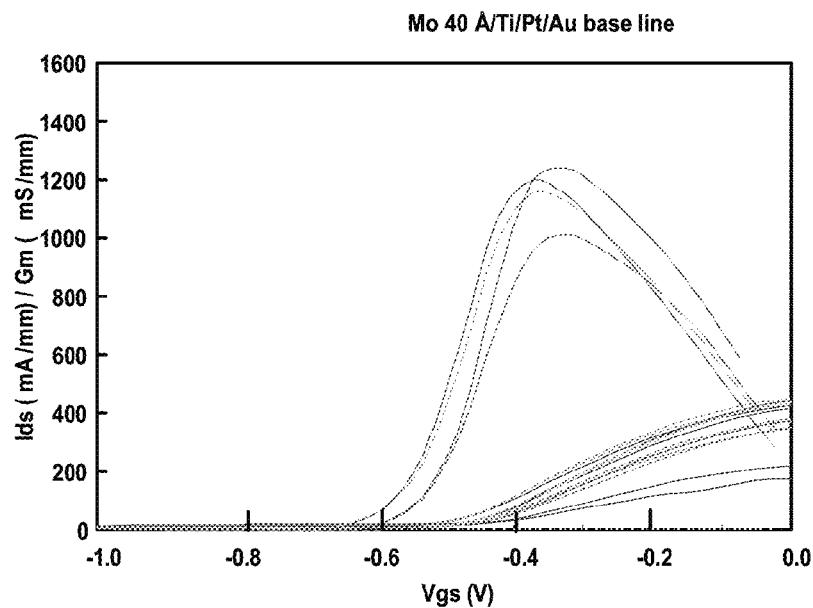
FIG. 2 is a representation of a device uniformity plot for a molybdenum based transistor.
Figure 3:
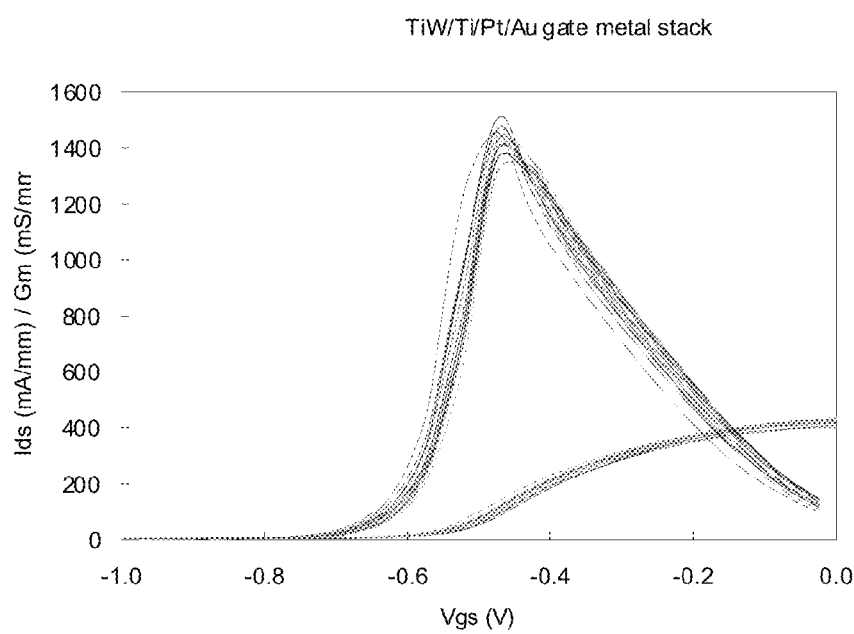
FIG. 3 is a representation of a device uniformity plot for a transistor of the semiconductor structure of FIG. 1.
Figure 4:
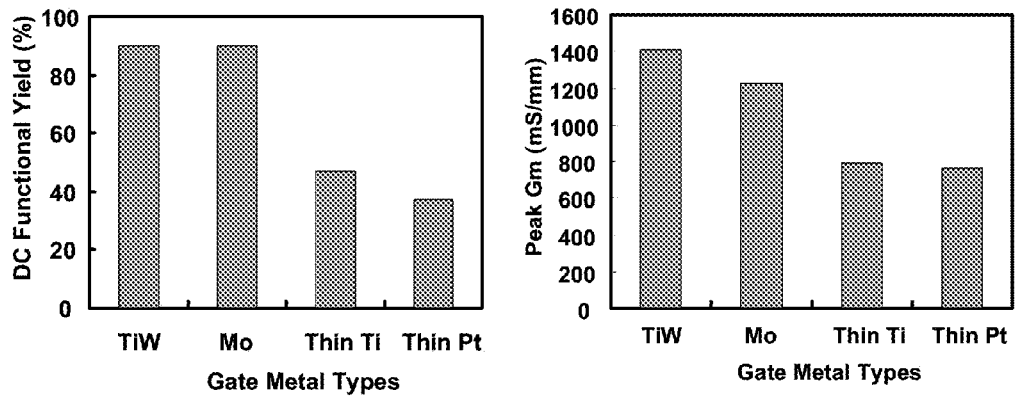
FIG. 4 is a representation of an electrical performance plot for several gate materials.
Figure 5:
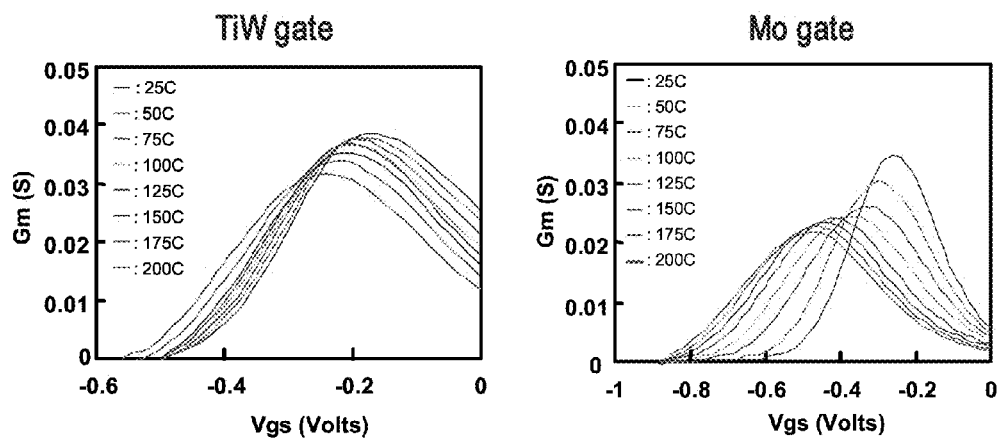
FIG. 5 is a representation of a thermal stability comparison for the transistors of FIGS. 2 and 3.
Figure 6:
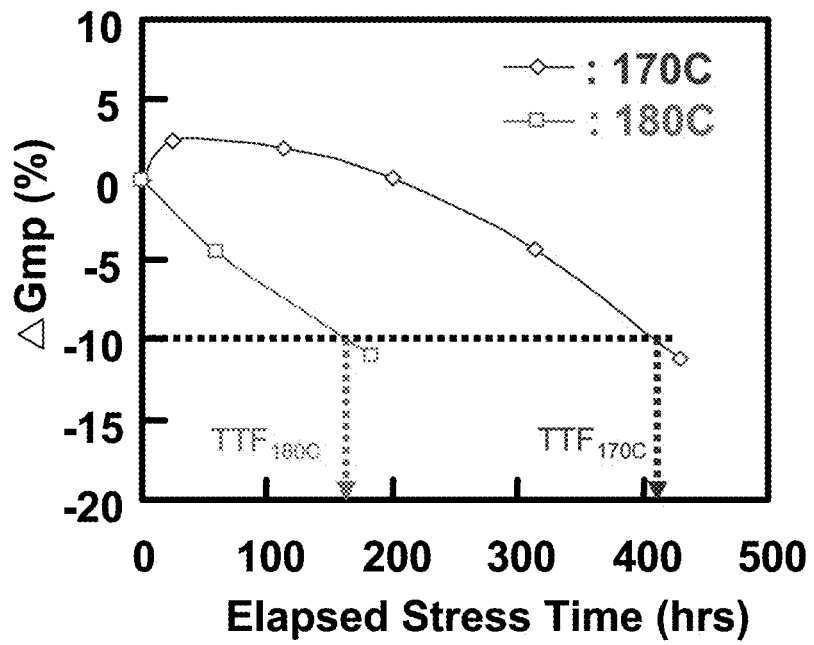
FIG. 6 is a representation of an on-wafer reliability plot for the transistor of FIG. 3.
Figure 7:
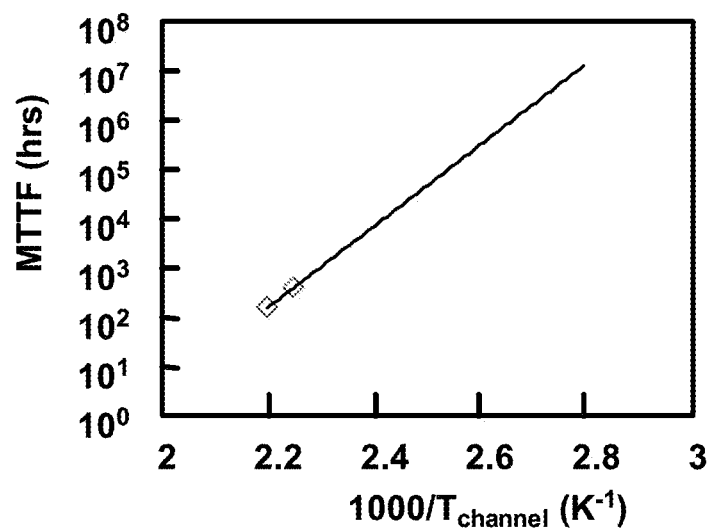
FIG. 7 is a representation of another on-wafer reliability plot for the transistor of FIG. 3.

Turning to FIG. 2, a device uniformity plot for a transistor with an ABCS stack and a gate stack of molybdenum, titanium, platinum, and gold is shown. Turning to FIG. 3, a device uniformity plot for a transistor with the semiconductor structure of FIG. 1 is shown. Turning to FIG. 4, electrical performance plots for several gate materials for the base layer 132 are shown. Turning to FIG. 5, one example of a thermal stability comparison for the transistors of FIGS. 2 and 3 is shown. Turning to FIGS. 6 and 7, example results from an on-wafer reliability test for the transistor of FIG. 3 are shown.

Turning to FIG. 8, one example of a process flow 802 for deposition of the base layer 132 is shown. The process flow 802 in one example comprises an electron beam evaporation process. A cavity is drilled or formed within (STEP 804) a titanium tungsten sample. The titanium tungsten sample in one example comprises a 15 cm$^3$ block or cylinder of titanium tungsten. A titanium tungsten pellet is placed (STEP 806) in the cavity. The cavity in one example is 0.25 inches in diameter and the titanium tungsten pellet is a 0.25 inch cube. The titanium tungsten pellet is bombarded (STEP 808) with an electron beam to evaporate the titanium tungsten pellet. The electron beam may be controlled to adjust the evaporation rate and accordingly the deposition rate of the titanium tungsten. In one example, the deposition rate is regulated to approximately 0.3 angstroms per second. The titanium tungsten pellet may be replaced for subsequent deposition sessions. With the regulated deposition rate of 0.3 angstroms per second, the base layer 132 in one example is formed in approximately 60 to 180 seconds. The relatively short duration of the deposition reduces damage to the ABCS stacks 104 and 106. In addition, the relatively thin layer of titanium tungsten of the base layer 132 has low mechanical stress, as will be appreciated by those skilled in the art.

The steps or operations described herein are just for example. There may be many variations to these steps or operations without departing from the spirit of the invention. For instance, the steps may be performed in a differing order, or steps may be added, deleted, or modified.

Although example implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. A method, comprising the steps of:
   forming an upper barrier layer of indium, aluminum, and arsenic on an antimonide-based compound semiconductor (ABCS) stack;
   forming on the upper barrier layer a gate stack comprising a base layer that consists of titanium and tungsten, the base layer having a thickness of approximately 20-50 angstroms; and
   forming on the base layer a gate barrier layer, the gate barrier layer comprising a lower gate barrier layer comprising titanium, the gate barrier layer further comprising an upper gate barrier layer comprising platinum.

2. The method of claim 1, further comprising the step of:
   forming the ABCS stack from layers of one or more of a gallium arsenide substrate, a gallium arsenide buffer layer, an aluminum gallium antimony buffer layer, an aluminum antimonide layer, an indium arsenide layer, and an indium arsenide and silicon layer.

3. The method of claim 1, further comprising the step of:
   forming the ABCS stack from layers of a gallium arsenide substrate, a gallium arsenide buffer layer, an aluminum gallium antimony buffer layer, a first aluminum antimonide layer, an indium arsenide layer, a second aluminum antimonide layer, an indium arsenide and silicon layer, and a third aluminum antimonide layer.

4. The method of claim 1, wherein the step of forming the base layer that consists of titanium and tungsten reduces the diffusion of the contact layer into the ABCS stack.

5. The method of claim 1, wherein the step of forming the base layer that consists of titanium and tungsten comprises the sub-step of:
   forming the base layer through an electron beam evaporation process.

6. The method of claim 5, wherein the step of forming the base layer through the electron beam evaporation process comprises the sub-step of:
   forming a cavity in a sample comprising at least one of titanium and tungsten.

7. The method of claim 5, wherein the step of forming the base layer through the electron beam evaporation process comprises the sub-step of:
   forming a cavity in a sample comprising titanium and tungsten.

8. The method of claim 6, wherein the step of forming the base layer through the electron beam evaporation process comprises the sub-step of:
   placing a pellet comprising at least one of titanium and tungsten within the cavity formed within the sample.

9. The method of claim 6, wherein the step of forming the base layer through the electron beam evaporation process comprises the sub-step of:
   placing a pellet comprising titanium and tungsten within the cavity formed within the sample.

10. The method of claim 8, wherein the step of forming the base layer through the electron beam evaporation process comprises the sub-step of:
    bombarding the pellet placed within the cavity with an electron beam to cause the evaporation of the pellet.

11. The method of claim 5, wherein the step of forming the base layer through the electron beam evaporation process comprises the sub-steps of:
  forming a cavity in a sample comprising titanium and tungsten;
  placing a pellet comprising titanium and tungsten within the cavity formed within the sample; and
  bombarding the pellet with an electron beam to cause the evaporation of the pellet.

12. The method of claim 11, wherein the sub-step of bombarding the pellet with the electron beam comprises the step of:
  adjusting the electron beam to regulate a deposition rate of at least one of titanium and tungsten.

13. The method of claim 11, further comprising the step of:
  replacing the pellet with a new pellet after forming the base layer.

14. The method of claim 5, further comprising the step of:
  forming the ABCS stack from layers of one or more of a gallium arsenide substrate, a gallium arsenide buffer layer, an aluminum gallium antimony buffer layer, an aluminum antimonide layer, an indium arsenide layer, and an indium arsenide and silicon layer.

15. The method of claim 5, further comprising the step of:
  forming the ABCS stack from layers of a gallium arsenide substrate, a gallium arsenide buffer layer, an aluminum gallium antimony buffer layer, a first aluminum antimonide layer, an indium arsenide layer, a second aluminum antimonide layer, an indium arsenide and silicon layer, and a third aluminum antimonide layer.

16. A method, comprising the steps of:
  forming an upper barrier layer of indium, aluminum, and arsenic on an antimonide-based compound semiconductor (ABCS) stack;
  forming on the upper barrier layer, using a beam evaporation process, a gate stack comprising a base layer that consists of titanium and tungsten, the base layer having a thickness of approximately 20-50 angstroms, wherein
    wherein the step of forming the base layer through the electron beam evaporation process comprises the sub-steps of:
    forming a cavity in a sample comprising titanium and tungsten;
    placing a pellet comprising titanium and tungsten within the cavity formed within the sample; and
    bombarding the pellet with an electron beam to cause the evaporation of the pellet; and
  forming on the base layer a gate barrier layer, the gate barrier layer comprising a lower gate barrier layer comprising titanium, the gate barrier layer further comprising an upper gate barrier layer comprising platinum.

17. The method of claim 16, further comprising the step of:
  replacing the pellet with a new pellet after forming the base layer.

18. The method of claim 16, wherein the sub-step of bombarding the pellet with the electron beam comprises the sub-sub-step of:
  adjusting the electron beam to regulate a deposition rate of at least one of titanium and tungsten.

19. The method of claim 16, wherein the sub-step of bombarding the pellet with the electron beam comprises the sub-sub-step of:
  adjusting the electron beam to regulate a deposition rate of titanium and to regulate a deposition rate of tungsten.

20. A method, comprising the steps of:
  forming an upper barrier layer of indium, aluminum, and arsenic on an antimonide-based compound semiconductor (ABCS) stack;
  forming on the upper barrier layer, using a beam evaporation process, a gate stack comprising a base layer that consists of titanium and tungsten, the base layer having a thickness of approximately 20-50 angstroms, wherein
    wherein the step of forming the base layer through the electron beam evaporation process comprises the sub-steps of:
    forming a cavity in a sample comprising titanium and tungsten;
    placing a pellet comprising titanium and tungsten within the cavity formed within the sample; and
    bombarding the pellet with an electron beam to cause the evaporation of the pellet,
      wherein the sub-step of bombarding the pellet with the electron beam comprises the sub-sub-step of:
      adjusting the electron beam to regulate a deposition rate of titanium and to regulate a deposition rate of tungsten; and
  forming on the base layer a gate barrier layer, the gate barrier layer comprising a lower gate barrier layer comprising titanium, the gate barrier layer further comprising an upper gate barrier layer comprising platinum.

* * * * *